(12) United States Patent
Camacho et al.

(10) Patent No.: US 7,449,369 B2
(45) Date of Patent: Nov. 11, 2008

(54) INTEGRATED CIRCUIT PACKAGE SYSTEM WITH MULTIPLE MOLDING

(75) Inventors: Zigmund Ramirez Camacho, Singapore (SG); Jose Alvin Caparas, Singapore (SG); Arnel Trasporto, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 44 days.

(21) Appl. No.: 11/338,328

(22) Filed: Jan. 23, 2006

(65) Prior Publication Data

US 2007/0170554 A1    Jul. 26, 2007

(51) Int. Cl.
*H01L 21/00* (2006.01)
(52) U.S. Cl. .................. 438/123; 438/124; 257/E21.51; 257/E21.502

(58) Field of Classification Search ................. 257/666; 438/111, 112, 123, 124
See application file for complete search history.

(56) References Cited

U.S. PATENT DOCUMENTS

| | | | |
|---|---|---|---|
| 5,541,446 A | | 7/1996 | Kierse |
| 5,929,514 A | | 7/1999 | Yalamanchili |
| 5,942,794 A | * | 8/1999 | Okumura et al. ............ 257/666 |
| 6,168,975 B1 | | 1/2001 | Zhang et al. |
| 6,225,683 B1 | | 5/2001 | Yalamanchili et al. |
| 6,359,221 B1 | | 3/2002 | Yamada et al. |
| 6,555,918 B2 | | 4/2003 | Masuda et al. |
| 6,906,424 B2 | | 6/2005 | Kinsman |
| 7,119,421 B2 | * | 10/2006 | Rohrmoser et al. ......... 257/666 |
| 7,129,569 B2 | | 10/2006 | Punzalan et al. |
| 7,161,232 B1 | | 1/2007 | Lee et al. |
| 2003/0038361 A1 | * | 2/2003 | Nakamura .................. 257/696 |
| 2004/0004275 A1 | * | 1/2004 | Chen et al. .................. 257/676 |

* cited by examiner

*Primary Examiner*—David A Zarneke
(74) *Attorney, Agent, or Firm*—Mikio Ishimaru

(57) ABSTRACT

An integrated circuit package system is provided forming a lead from a padless lead frame, and encapsulating the lead for supporting an integrated circuit die with a first molding compound for encapsulation with a second molding compound.

11 Claims, 6 Drawing Sheets

INTEGRATED CIRCUIT PACKAGE SYSTEM WITH MULTIPLE MOLDING

CROSS-REFERENCES TO RELATED APPLICATIONS

The present application contains subject matter related to a copending U.S. patent application Ser. No. 11/339,176 by Zigmund Ramirez Camacho, Henry D. Bathan, Arnel Trasporto, and Jeffrey D. Punzalan entitled "Padless Support Integrated Circuit Package System". The related application is assigned to STATS ChipPAC Ltd., and is herein incorporated by reference in its entirety.

TECHNICAL FIELD

The present invention relates generally to integrated circuit packages and more particularly to leaded integrated circuit packages.

BACKGROUND ART

Consumer electronics requirements demand more integrated circuits in an integrated circuit package while paradoxically providing less physical space in the system for the increased integrated circuits content. Cost reduction is a continuous requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern consumer electronics, such as smart phones, personal digital assistants, and location based services devices, are packing more integrated circuits into an ever shrinking physical space with expectations for decreasing cost. Contemporary consumer electronics expose integrated circuits and packages to more demanding and sometimes new environmental conditions, such as cold, heat, and humidity. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use mature package technologies with existing manufacturing methods and equipments. Paradoxically, the reuse of existing manufacturing processes does not typically result in the reduction of package dimensions. Existing packaging technologies struggle to cost effectively meet the ever demanding environmental conditions today's integrated circuits and packages must endure.

Thus, a need still remains for an integrated circuit package system providing low cost manufacturing, improved environmental performance, and reduce the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a lead from a padless lead frame, and encapsulating the lead for supporting an integrated circuit die with a first molding compound for encapsulation with a second molding compound.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. The same numbers are used in all the figures to relate to the same elements.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Figure 1:
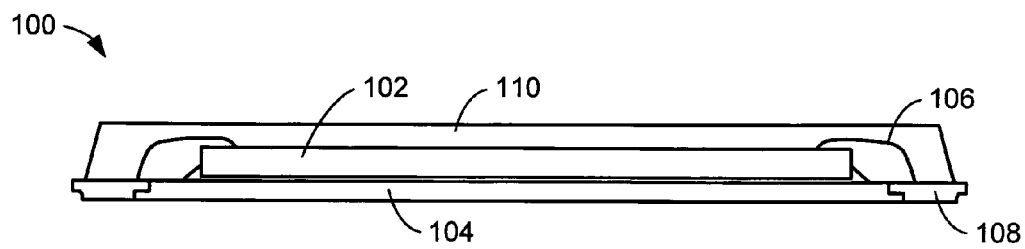
FIG. 1 is a cross-sectional view of a first integrated circuit package system in an embodiment of the present invention.

Referring now to FIG. 1, therein is shown a cross-sectional view of a first integrated circuit package system 100 in an embodiment of the present invention. The first integrated circuit package system 100 includes an integrated circuit die 102 on a first molding compound 104, such as a pre-mold. Electrical interconnects 106, such as bond wires or reverse stitch standoff bumps (RSSB), are between the integrated circuit die 102 and external interconnects 108, such as lead fingers of a lead frame (not shown), used to connect to the next system level (not shown), such as a printed circuit board. A second molding compound 110 encapsulates the integrated circuit die 102, the electrical interconnects 106, and a top of the external interconnects 108. The second molding compound 110 also forms a hermetic seal attaching to the first molding compound 104.

For illustrative purposes, the first molding compound 104 and the second molding compound 110 are shown as different, although it is understood the material may not be different. Also for illustrative purpose, the external interconnects 108 are shown as a single row of lead fingers, although it is understood that the external interconnects 108 may be more than one row.

Figure 2:
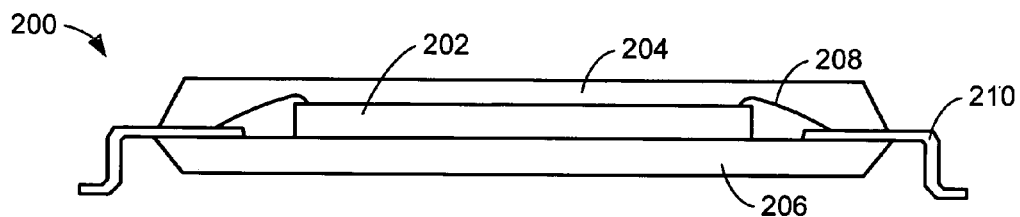
FIG. 2 is a cross-sectional view of a second integrated circuit package system in an alternative embodiment of the present invention.

Referring now to FIG. 2, therein is shown a cross-sectional view of a second integrated circuit package system 200 in an alternative embodiment of the present invention. The second integrated circuit package system 200 includes an integrated circuit die 202, a first molding compound 204, and a second molding compound 206. The integrated circuit die 202 is on the second molding compound 206. Electrical interconnects 208, such as bond wires or reserve stitch bonds, are between the integrated circuit die 202 and external interconnects 210, such as lead fingers of a lead frame (not shown). The first molding compound 204 encapsulates the integrated circuit die 202 and the electrical interconnects 208. The first molding compound 204 with the second molding compound 206 encapsulate an inner portion of the external interconnects 210. The first molding compound 204 also forms a hermetic seal with the second molding compound 206.

The external interconnects 210 connect to the next system level (not shown), such as a printed circuit board. The height of the external interconnects 210 exceeds the height of the second molding compound 206 such that the second molding compound 206 does not impede the connections of the external interconnects 210 to the next system level.

For illustrative purposes, the first molding compound 204 and the second molding compound 206 are described as different, although it is understood the material may not be different. Also for illustrative purpose, the heights of the first molding compound 204 and the second molding compound 206 are shown similar, although it is understood that the heights may not be similar.

Figure 3:
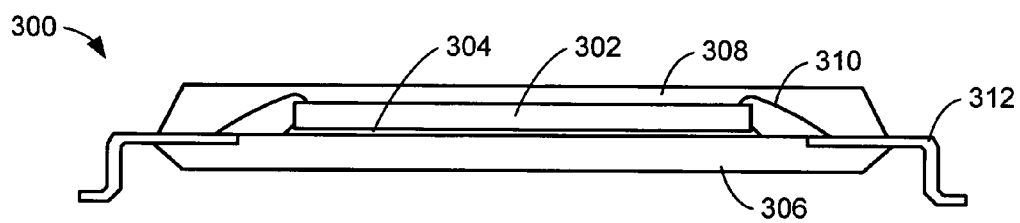
FIG. 3 is a cross-sectional view of a third integrated circuit package system in another alternative embodiment of the present invention.

Referring now to FIG. 3, therein is shown a cross-sectional view of a third integrated circuit package system 300 in another alternative embodiment of the present invention. The third integrated circuit package system 300 includes an integrated circuit die 302, an adhesive 304, a first molding compound 306, and a second molding compound 308. The integrated circuit die 302 is on the first molding compound 306 with the adhesive 304 in between. Electrical interconnects 310, such as bond wires or reserve stitch bonds, are between the integrated circuit die 302 and external interconnects 312, such as lead fingers of a lead frame (not shown). The second molding compound 308 encapsulates the integrated circuit die 302 and the electrical interconnects 310. The first molding compound 306 with the second molding compound 308 encapsulate an inner portion of the external interconnects 312. The first molding compound 306 also forms a hermetic seal with the second molding compound 308.

The external interconnects 312 connect to the next system level (not shown), such as a printed circuit board. The height of the external interconnects 312 exceeds the height of the first molding compound 306 such that the first molding compound 306 does not impede the connections of the external interconnects 312 to the next system level.

For illustrative purposes, the first molding compound 306 and the second molding compound 308 are described as different, although it is understood the material may not be different. Also for illustrative purpose, the heights of the first molding compound 306 and the second molding compound 308 are shown similar, although it is understood that the heights may not be similar.

Figure 4:
FIG. 4 is a cross-sectional view of a lead frame of the first integrated circuit package system of FIG. 1.

Referring now to FIG. 4, therein is shown a cross-sectional view of a lead frame 400 of the first integrated circuit package system 100 of FIG. 1. The lead frame 400 is singular or as part of an array of the lead frame 400. The lead frame 400 includes the external interconnects 108 with a space 402 interior to the external interconnects 108. The external interconnects 108 have an interior portion 404, an outer portion 406, and an external contact portion 408. The interior portion 404 and the outer portion 406 have the bottom surface elevated to the bottom of the external contact portion 408 such that the bottom of the external contact portion 408 may connect to the next system level (not shown).

Figure 5:
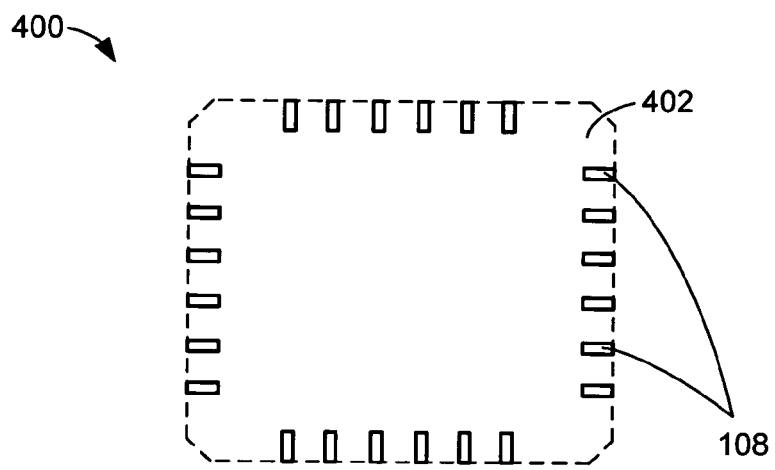
FIG. 5 is a bottom view of the lead frame of the first integrated circuit package system of FIG. 1.

Referring now to FIG. 5, therein is shown a bottom view of the lead frame 400 of the first integrated circuit package system 100 of FIG. 1. The lead frame 400 includes the external interconnects 108 with the space 402 between and interior to the external interconnects 108. The bottom view also depicts an outline of the first integrated circuit package system 100.

Figure 6:
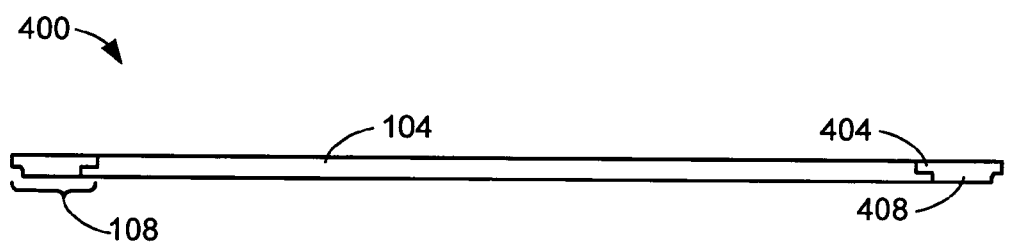
FIG. 6 is a cross-sectional view of the lead frame of the first integrated circuit package system of FIG. 1 in a pre-mold phase.

Referring now to FIG. 6, therein is shown a cross-sectional view of the lead frame 400 of the first integrated circuit package system 100 of FIG. 1 in a pre-mold phase. The first molding compound 104 encapsulates the external interconnects 108. The height of the first molding compound 104 is similar as the height of the external contact portion 408 of the external interconnects 108 such that the first molding compound 104 does not impede the connections of the external interconnects 108 to the next system level (not shown). The elevated surface of the interior portion 404 provides registration of the first molding compound 104.

Figure 7:
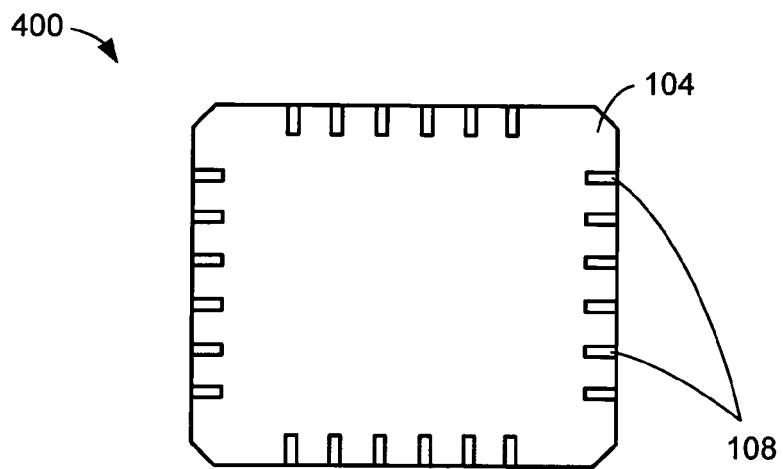
FIG. 7 is a bottom view of the lead frame of the first integrated circuit package system of FIG. 1 in the pre-mold phase.

Referring now to FIG. 7, therein is shown a bottom view of the lead frame 400 of the first integrated circuit package system 100 of FIG. 1 in the pre-mold phase. The first molding compound 104 is between and interior to the external interconnects 108. For illustrative purpose, the first molding compound 104 is shown as the outline of the first integrated circuit package system 100 of FIG. 1, although it is understood that the first molding compound 104 may not be constrained to the outline of the first integrated circuit package system 100 in the pre-mold phase.

Figure 8:
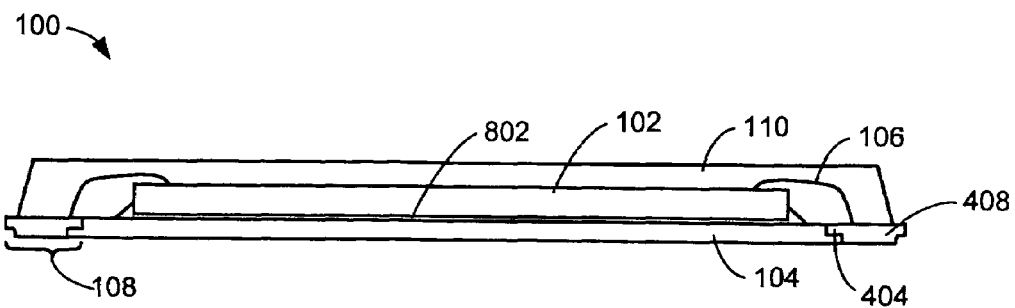
FIG. 8 is a cross-sectional view of the first integrated circuit package system in a mounting phase.

Referring now to FIG. 8, therein is shown a cross-sectional view of the first integrated circuit package system 100 in a mounting phase. The integrated circuit die 102 attaches to the first molding compound 104 with an adhesive 802. The electrical interconnects 106 connect the integrated circuit die 102 and the external interconnects 108. The second molding compound 110 encapsulates the integrated circuit die 102, the electrical interconnects 106, a top of the interior portion 404 of the external interconnects 108, and a portion of a top of the external contact portion 408 of the external interconnects 108.

The first molding compound 104 and the second molding compound 110 with a two step encapsulation forms the hermetic seal providing improved moisture sensitivity level (MSL) testing performance. The better the MSL performance, the better an integrated circuit package system may withstand environments with humidity. The integrated circuit die 102 may be thinned, the electrical interconnects 106 may provide a low or small loop height, and the second molding compound 110 may be planarized providing a low profile of the first integrated circuit package system 100.

Figure 9:
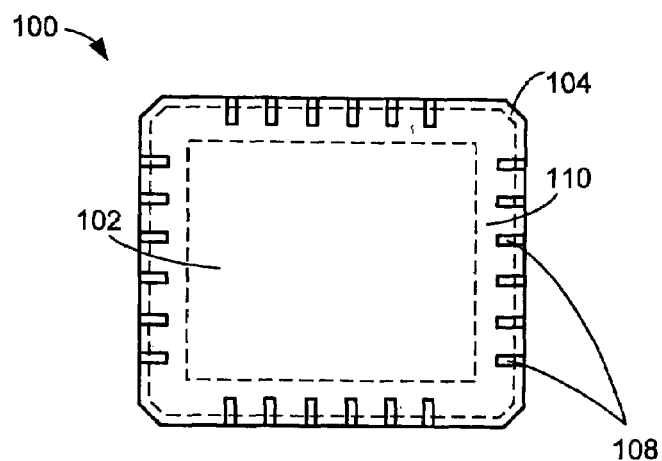
FIG. 9 is a plan view of the first integrated circuit package system in the mounting phase.

Referring now to FIG. 9, therein is shown a plan view of the first integrated circuit package system 100 in the mounting phase. The plan view depicts the integrated circuit die 102, the first molding compound 104 outlining the first integrated circuit package system 100, the second molding compound 110, and the external interconnects 108.

Figure 10:
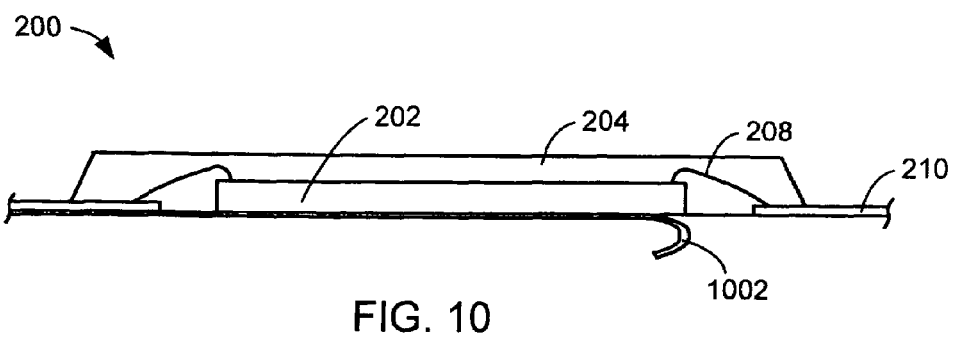
FIG. 10 is a cross-sectional view of the second integrated circuit package system in a first encapsulation phase.

Referring now to FIG. 10, therein is shown a cross-sectional view of the second integrated circuit package system 200 in a first encapsulation phase. A coverlay tape 1002 attaches to a bottom of the external interconnects 210. The integrated circuit die 202 attaches to the coverlay tape 1002. The electrical interconnects 208 connect the integrated circuit die 202 to a top of the external interconnects 210.

The first molding compound 204 encapsulates the integrated circuit die 202, the electrical interconnects 208, and a portion of the top of the external interconnects 210. The coverlay tape 1002 provides a planar boundary for the first molding compound 204 such that a bottom of the first molding compound 204 between the external interconnects 210 and the integrated circuit die 202 is substantially in the same plane as a bottom of the integrated circuit die 202. The coverlay tape 1002 is removed for further processing. For illustrative purpose, the coverlay tape 1002 is shown as partially peeled, although it is understood that it is for illustration depicting the removal of the coverlay tape 1002.

Figure 11:
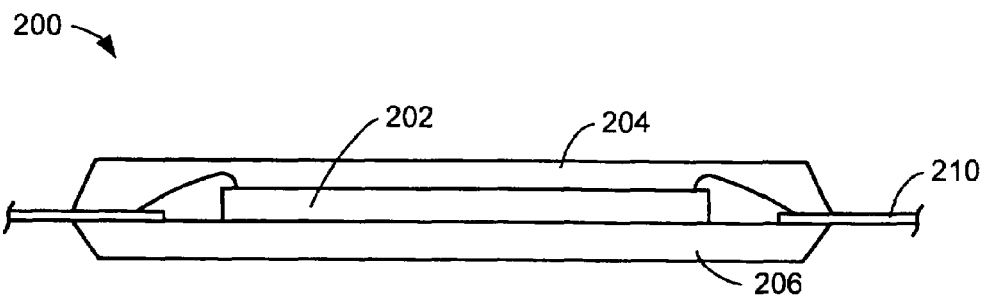
FIG. 11 is a cross-sectional view of the second integrated circuit package system in a second encapsulation phase.

Referring now to FIG. 11, therein is shown a cross-sectional view of the second integrated circuit package system 200 in a second encapsulation phase. The second molding compound 206 with the first molding compound 204 encapsulate the integrated circuit die 202 and the external interconnects 210 providing the hermetic seal and improved moisture sensitivity level (MSL) testing performance.

Figure 12:
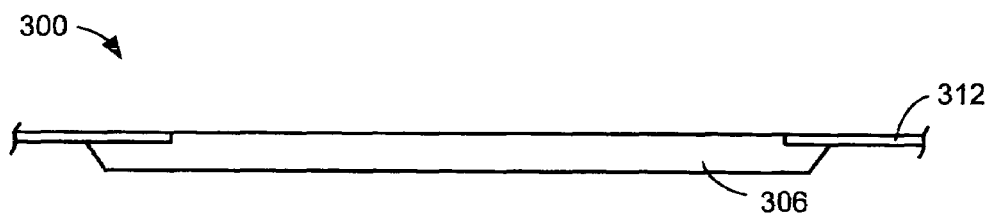
FIG. 12 is a cross-sectional view of the third integrated circuit package system in a first encapsulation phase.

Referring now to FIG. 12, therein is shown a cross-sectional view of the third integrated circuit package system 300 in a first encapsulation phase. The first molding compound 306 encapsulates a bottom of an inner portion of the external interconnects 312. The top of the first molding compound 306 is substantially in the same plane as a top of the inner portion of the external interconnects 312.

Figure 13:
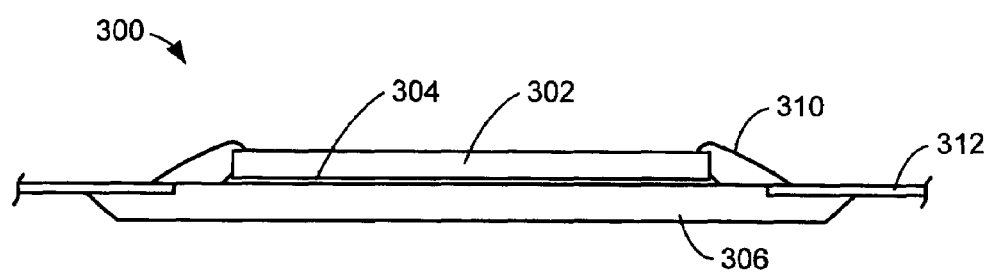
FIG. 13 is a cross-sectional view of the third integrated circuit package system in a mounting phase.

Referring now to FIG. 13, therein is shown a cross-sectional view of the third integrated circuit package system 300 in a mounting phase. The integrated circuit die 302 attaches to the first molding compound 306 with the adhesive 304. The electrical interconnects 310 connect the integrated circuit die 302 to the top of the inner portion of the external interconnects 312.

Figure 14:
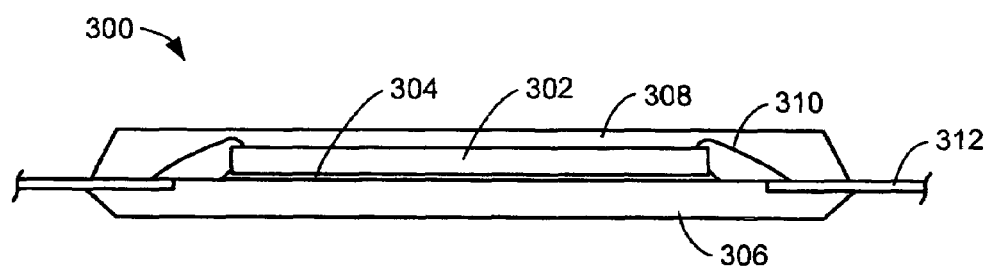
FIG. 14 is a cross-sectional view of the third integrated circuit package system in a second encapsulation phase.

Referring now to FIG. 14, therein is shown a cross-sectional view of the third integrated circuit package system 300 in a second encapsulation phase. The second molding compound 308 encapsulates the integrated circuit die 302, the electrical interconnects 310, the adhesive 304, and the top of the inner portion of the external interconnects 312. The second molding compound 308 attaches to the first molding compound 306 encapsulating the inner portion of the external interconnects 312 and forming the hermetic seal. The first molding compound 306 with the second molding compound 308 provides improved moisture sensitivity level testing performance.

Figure 15:
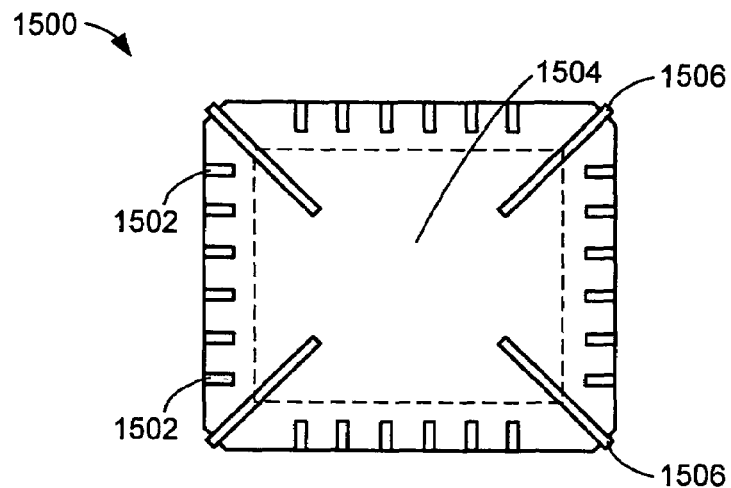
FIG. 15 is a plan view of a first lead frame of an integrated circuit package system.

Referring now to FIG. 15, therein is shown a plan view of a first lead frame 1500 of an integrated circuit package system. The first lead frame 1500 includes external interconnects 1502 for connections with an integrated circuit die 1504 and to a next system level (not shown). The first lead frame 1500 also includes support segments 1506 from the corners of the first lead frame 1500 without connection to each other. The support segments 1506 may be part of tie bars (not shown) of the first lead frame 1500. The support segments 1506 may be used to support the integrated circuit die 1504 or provide mechanical structure support for the first molding compound 104 of FIG. 1, especially for the integrated circuit die 1504 having large width and length. The support segments 1506 may be encased in the first molding compound 104 or exposed to the integrated circuit die 1504 or to the next system level or a combination thereof.

Figure 16:
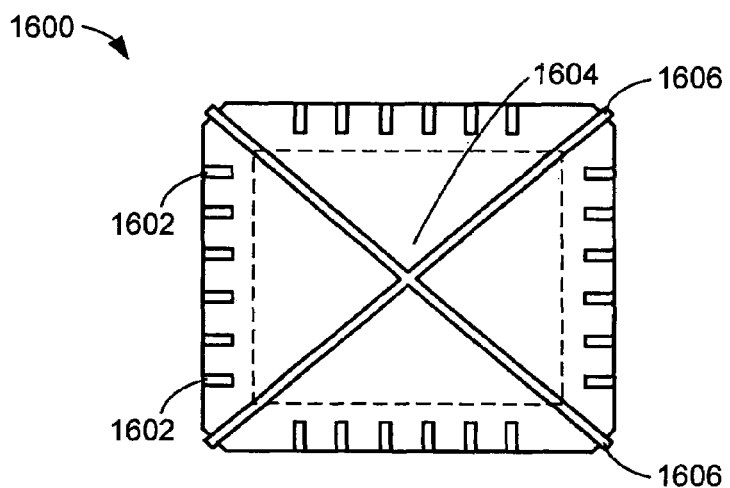
FIG. 16 is a plan view of a second lead frame of an integrated circuit package system.

Referring now to FIG. 16, therein is shown a plan view of a second lead frame 1600 of an integrated circuit package system. The second lead frame 1600 includes external interconnects 1602 for connections with an integrated circuit die 1604 and to a next system level (not shown). The second lead frame 1600 also includes supports 1606 from the corners of the first lead frame 1500 connecting at an interior with each other. The supports 1606 may be part of tie bars (not shown) of the second lead frame 1600 extending from one corner to a diagonal corner of the second lead frame 1600. The supports 1606 may be used to support the integrated circuit die 1604 or provide mechanical structure support for the first molding compound 104 of FIG. 1, especially for the integrated circuit die 1604 having large width and length. The supports 1606 may be encased in the first molding compound 104 or exposed to the integrated circuit die 1604 or to the next system level or a combination thereof.

Figure 17:
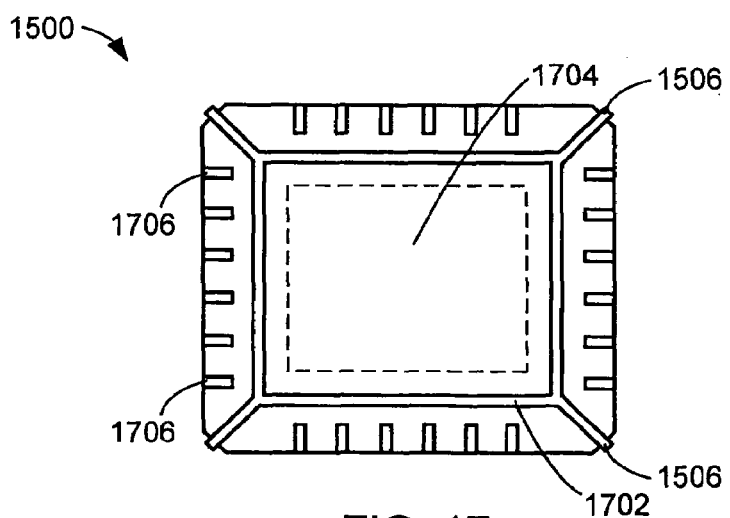
FIG. 17 is a plan view of the first lead frame with a ground ring of an integrated circuit package system.

Referring now to FIG. 17, therein is shown a plan view of the first lead frame 1500 with a ground ring 1702 of an integrated circuit package system. The ground ring 1702 connects the support segments 1506 providing additional ground isolation and ground bonding sites for an integrated circuit die 1704. The support segments 1506 and the ground ring 1702 not part of external interconnects 1706. The external interconnects 1706 connect to the next system level (not shown), such as a printed circuit board. The support segments 1506 and the ground ring 1702 may connect to the next system level. The ground ring 1702 may be included in the first integrated circuit package system 100 of FIG. 1, the second integrated circuit package system 200 of FIG. 2, and the third integrated circuit package system 300 of FIG. 3.

Figure 18:
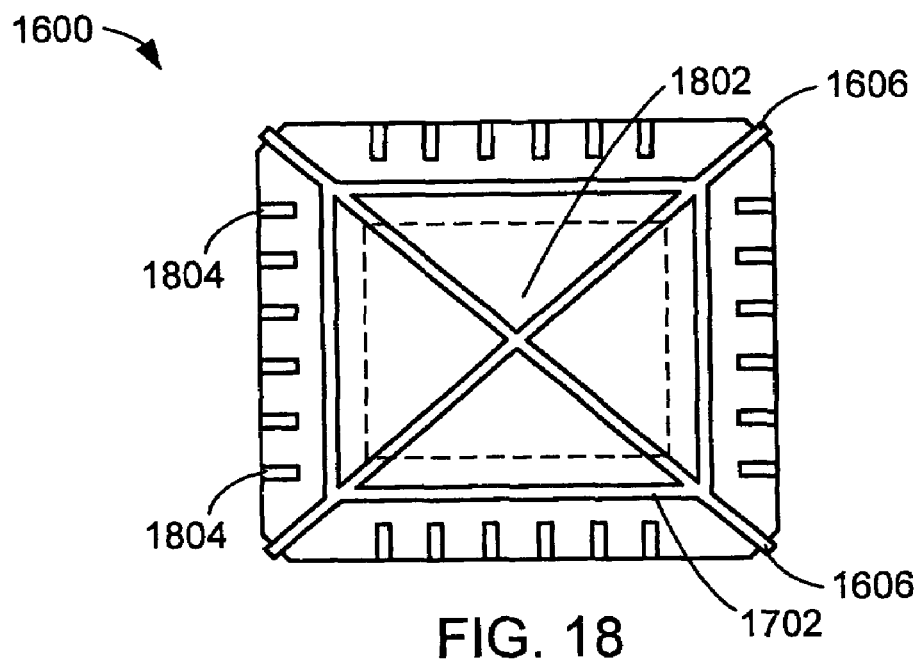
FIG. 18 is a plan view of the second lead frame with the ground ring of an integrated circuit package system.

Referring now to FIG. 18, therein is shown a plan view of the second lead frame 1600 with the ground ring 1702, an integrated circuit package system. The ground ring 1702 connects the supports 1606 providing additional ground isolation and ground bonding sites for an integrated circuit die 1802. The supports 1606 and the ground ring 1702 not part of external interconnects 1804. The external interconnects 1804 connect to the next system level (not shown), such as a printed circuit board. The supports 1606 and the ground ring 1702 may connect to the next system level.

Figure 19:
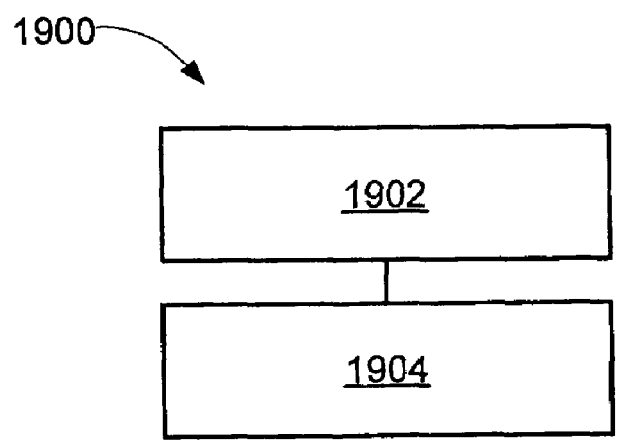
FIG. 19 is a flow chart of an integrated circuit package system for manufacture of the integrated circuit package system in an embodiment of the present invention.

Referring now to FIG. 19, therein is shown a flow chart of an integrated circuit package system 1900 for manufacture of the first integrated circuit package system 100 in an embodiment of the present invention. The system 1900 includes forming a lead from a padless lead frame in a block 1902; and encapsulating the lead for supporting an integrated circuit die with a first molding compound for encapsulation with a second molding compound in a block 1904.

It has been discovered that the present invention thus has numerous aspects.

It has been discovered that the integrated circuit package system provides a low cost manufacturing solution by simplifying handling methods, simplifying some manufacturing equipment design, alleviates the need for some stringent processes to lower cost processes, and eliminates other causes that may result in potential yield issues.

An aspect is that the present invention provides two-step molding of the integrated circuit package, such as leaded QFP or QLP packages, encasing the integrated circuit die and corresponding wire interconnects connecting the integrated circuit die to the integrated circuit package leads or pins. The two-step molding forms the hermetic seal improving the moisture sensitivity level (MSL) testing performance of the integrated circuit package. The better the MSL performance, the better the integrated circuit package withstand environmental conditions involving higher humidity or moisture.

Another aspect of the present invention is the elimination of the die-attach adhesive providing another means to further reduce manufacturing cost and improve MSL performance, such as in the second integrated circuit package system 200.

Yet another aspect of the present invention is that the integrated circuit package resulting from the two-molding process provides a padless lead frame where the first molding compounding supports the integrated circuit die. The first molding compound serves as a replacement to the die paddle. The padless lead frame eliminates the die-attach paddle (DAP) to epoxy molding compound (EMC) interfacial area which is generally a source of failure in MSL testing. The simplified EMC to die-attach (D/A) adhesive interfacial area, such as in the first integrated circuit package system 100 and the third integrated circuit package system 300, and die to EMC interfacial area, such as the second integrated circuit package system 200, may improve the mechanical stress model for the resulting package due to the elimination of the copper-EMC-D/A epoxy interfacial areas which is a generally a source of problems due to a relative high coefficient thermal expansion (CTE) difference.

Yet another important aspect of the present invention is that it valuably supports and services the historical trend of reducing costs and increasing performance. These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

The invention claimed is:

1. A method for manufacturing an integrated circuit package system comprising:
   forming a lead from a padless lead frame; and
   encapsulating the lead for supporting an integrated circuit die with a first molding compound for encapsulation with a second molding wherein encapsulating the lead for supporting the integrated circuit die with the first molding compound for encapsulation with the second molding compound comprises:
      encapsulating the lead of the padless lead frame having a space with the first molding compound;
      attaching the integrated circuit die on the first molding compound;
      connecting an electrical interconnect between the integrated circuit die and the lead; and
      encapsulating the integrated circuit die, the electrical interconnect, and a portion of the top of the lead with the second molding compound.

2. A method for manufacturing an integrated circuit package system comprising:
   forming a lead from a padless lead frame; and
   encapsulating the lead for supporting an integrated circuit die with a first molding compound for encapsulation with a second molding compound, wherein encapsulating the lead for supporting the integrated circuit die with the first molding compound for encapsulation with the second molding compound comprises:
      encapsulating a bottom of an inner portion of the lead of the padless lead frame with the first molding compound;
      attaching the integrated circuit die on the first molding compound with an adhesive;
      connecting an electrical interconnect between the integrated circuit die and the lead; and
      encapsulating the integrated circuit die, the electrical interconnect, and the inner portion of the lead with the second molding compound from a top of the inner portion of the lead.

3. The method as claimed in claim 1 wherein forming the lead from the padless lead frame comprises forming a support from a corner of the padless lead frame to a diagonal corner of the padless lead frame.

4. The method as claimed in claim 1 wherein forming the lead from the padless lead frame comprises:
   forming a support from a corner of the padless lead frame to a diagonal corner of the padless lead frame; and
   forming a ground ring with a connection between the support at the corner to the support at an adjacent corner.

5. A method for manufacturing an integrated circuit package system comprising:
   forming a lead from a padless lead frame;
   encapsulating the lead with a first molding compound;

attaching an integrated circuit die on the first molding compound with an adhesive; and encapsulating the integrated circuit die and the lead with a second molding compound.

6. The method as claimed in claim 5 wherein forming the lead from the padless lead frame comprises forming a support segment at a corner of the padless lead frame.

7. The method as claimed in claim 5 wherein forming the lead from the padless lead frame comprises:

forming a support segment at a corner of the padless lead frame; and forming a ground ring with a connection between the support segment at the corner to the support segment at an adjacent corner.

8. The method as claimed in claim 5 further comprising attaching an electrical interconnect between the integrated circuit die and the lead.

9. The method as claimed in claim 5 wherein encapsulating the integrated circuit die, the electrical interconnect, and the lead with the second molding compound comprises forming a hermetic seal with the first molding compound and the second molding compound.

10. The method as claimed in claim 2 wherein forming the lead from the padless lead frame comprises forming a support from a corner of the padless lead frame to a diagonal corner of the padless lead frame.

11. The method as claimed in claim 2 wherein forming the lead from the padless lead frame comprises:

forming a support from a corner of the padless lead frame to a diagonal corner of the padless lead frame; and forming a ground ring with a connection between the support at the corner to the support at an adjacent corner.

\* \* \* \* \*